United States Patent [19]

Egawa et al.

[11] Patent Number: 5,413,981
[45] Date of Patent: May 9, 1995

[54] OXIDE SUPERCONDUCTOR AND A METHOD FOR MANUFACTURING AN OXIDE SUPERCONDUCTOR

[75] Inventors: Kunihiko Egawa; Toshio Umemura; Shinichi Kinouchi; Mitsunobu Wakata; Shin Utsunomiya; Ayumi Nozaki, all of Amagasaki, Japan

[73] Assignee: Mitsubishi Denki Kabushiki Kaisha, Tokyo, Japan

[21] Appl. No.: 93,137

[22] Filed: Jul. 19, 1993

Related U.S. Application Data

[63] Continuation of Ser. No. 794,915, Nov. 20, 1991, abandoned.

[30] Foreign Application Priority Data

Jan. 31, 1991 [JP] Japan .................... 3-010989
Jul. 8, 1991 [JP] Japan .................... 3-194721

[51] Int. Cl.$^6$ .................. H01B 12/00; H01L 39/12
[52] U.S. Cl. ................ 505/121; 505/782; 505/785; 505/784; 505/124; 252/518; 252/521; 501/123; 423/592; 423/604
[58] Field of Search ............... 252/500, 518, 521; 505/1, 782, 785, 784, 124; 423/592, 604; 501/123

[56] References Cited

U.S. PATENT DOCUMENTS 5,114,909 5/1992 Shi ........................ 505/782

FOREIGN PATENT DOCUMENTS 0292126 11/1988 European Pat. Off. .
192401 7/1990 Japan .
2188445 7/1990 Japan .

OTHER PUBLICATIONS

Yoshida et al "Effects of the Platinum Group Element Addition . . . " Physica C 185–189 Dec. 1991 pp. 2409–2410.
"Preparation of $Bi_2Sr_2CaCu_2O_x$ Superconductors from Amorphous Films by Rapid Quenting after Rapid Melting"; M. Yoshimura et al; Japanese Journal of Applied Physics, vol. 27, No. 10, Oct. 1988, pp. L1877–L1879.
"Flux Pinning by Precipitates in the Bi–Sr–Ca–Cu–O system"; D. Shi et al; Physical Review B, vol. 40, No. 7, 1 Sep. 1989, pp. 5255–5258.

*Primary Examiner*—Paul Lieberman
*Assistant Examiner*—M. Kopec

[57] ABSTRACT

A method for manufacturing the oxide superconductor according to the present invention comprises the steps of: mixing a starting material including Bi, Sr, Ca and Cu such that a mole ratio of Bi, Sr, Ca and Cu is $2:2+a:1+b:2+c$, wherein $a \geq 0$, $b \geq 0$, $c \geq 0$, and $0 < a+b+c < 3$; melting the mixed material at a temperature of 900° C.–1500° C.; quenching rapidly the molten material; and annealing the quenched material at a partial molten temperature of 800° C.–1000° C. This method gives a product wherein a precipitate of at least one compound in the group SrO, CuO and $(Ca_{1-x}Sr_x)_2CuO_3$ (wherein $0 \geq x < 1$) is finely dispersed in the superconducting crystal of $Bi_2Sr_2Ca_1Cu_2O_y$ (wherein y is about 8). The precipitates act as flux pinning centers.

Further, an oxide superconductor according to the present invention comprises superconducting crystal consisting of Bi, Sr, Ca and Cu oxides and separate oxide phases including Pt as a principal component being finely dispersed in the superconducting crystal. These finely dispersed oxides including Pt act as flux pinning centers.

3 Claims, 6 Drawing Sheets

OXIDE SUPERCONDUCTOR AND A METHOD FOR MANUFACTURING AN OXIDE SUPERCONDUCTOR

This application is a continuation of application Ser. No. 07/794,915, filed on Nov. 20, 1991, now abandoned.

BACKGROUND OF THE INVENTION

This invention relates to an oxide superconductor which has a high critical temperature and a high critical current density, and a method for manufacturing such an oxide superconductor.

In prior art, oxide superconductors are known which have a critical temperature in excess of 77K which is the boiling point of nitrogen so that they can be utilized being refrigerated by liquid nitrogen. Examples of such oxide superconductors are Y—Ba—Cu—O, Bi—Sr—Ca—Cu—O and Tl—Ba—Ca—Cu-0. These oxide superconductors are generally obtained by heating starting materials such as oxides and carbonates at about 800°C., thereby thermally decomposing them, carrying out a solid phase reaction, grinding the product, compression molding the ground product and then sintering it.

However, the aforesaid conventional oxide superconductors had the disadvantage that their critical current density fell sharply when they were placed in a magnetic field. In particular, when oxide superconductors were used at liquid nitrogen temperature (77K), there was far more thermal disturbance than when metal superconductors are used at liquid helium temperature (4.2K), as a result of which there was a pronounced flux creep which rendered these oxide superconductors unsuitable for practical application. It has been demonstrated that pinning centers are effective in improving the current density and reducing the effect of flux creep in magnetic field, but no specific method of introducing pinning centers into oxide superconductors had yet been proposed.

SUMMARY OF THE INVENTION

An object of the present invention is to provide an oxide superconductor which has a high critical temperature and a small decrease of critical current density, and a method for manufacturing such an oxide superconductor.

One form of the method for manufacturing the oxide superconductor according to the present invention comprises the steps of: mixing a starting material including Bi, Sr, Ca and Cu such that a mole ratio of Bi, Sr, Ca and Cu is $2:2+a:1+b:2+c$, wherein $a \geq 0$, $b \geq 0$, $c \geq 0$, and $0 < a+b+c < 3$; melting the mixed material at a temperature of 900° C.–1500° C.; quenching rapidly the molten material; and annealing the quenched material at a partial-molten temperature of 800° C.–1000° C.

This method gives a product wherein a precipitate of at least one compound selected from the group consisting of SrO, CuO and $(Ca_{1-x}Sr_x)_2CuO_3$ (wherein $0 \geq x < 1$) is finely dispersed in the superconducting crystal of $Bi_2Sr_2Ca_1Cu_2O_y$ (wherein y is about 8). The precipitates act as magnetic flux pinning centers.

Further, one form of the oxide superconductor according to the present invention comprises: a superconducting crystal consisting of Bi, Sr, Ca and Cu oxides; and separate oxide phases including Pt as a principal component being finely dispersed in the superconducting crystal.

These finely dispersed oxide phases including Pt act as flux pinning centers.

Another form of the method for manufacturing of the oxide superconductor comprises the steps of: mixing a starting material including Bi, Sr, Ca and Cu with particles including Pt as a principle component; melting the mixed material at a temperature of 1300° C.–1600° C.; quenching rapidly the molten material; and annealing the quenched material at a partial-molten temperature of 800° C.–950° C.

Further, another form of the method for manufacturing of the oxide superconductor comprises the steps of: mixing a starting material including Bi, Sr, Ca and Cu; melting the mixed material; allowing the molten material to flow between twin rotating metal rollers set parallel to one another at a specified distance apart, and simultaneously spraying particles including Pt as a principal component through a nozzle toward a space between the metal rollers, thereby blending the particles with the molten material and quenching rapidly the molten material; and annealing the quenched material in an oxidizing atmosphere at a partial molten temperature of 800° C.–950° C.

In this manner, the particles including Pt are finely dispersed in the starting composition, and the starting composition is at the same time rapidly quenched by the metal rollers.

A still another form of the method for manufacturing of the oxide superconductor comprises the steps of: mixing a starting material including Bi, Sr, Ca and Cu; melting the mixed material; allowing the molten material fall on a rotating metal disc and simultaneously spraying particles including Pt as a principal component onto the surface of the metal disc, thereby mixing the particles with the molten material and quenching rapidly the molten material; and annealing the quenched material in an oxidizing atmosphere at a partial molten temperature of 800° C.–950° C.

In this manner, the particles including Pt are finely dispersed in the starting composition, and the starting composition is at the same time rapidly quenched by the rotating metal disc.

DETAILED DESCRIPTION OF THE INVENTION

Figure 1:
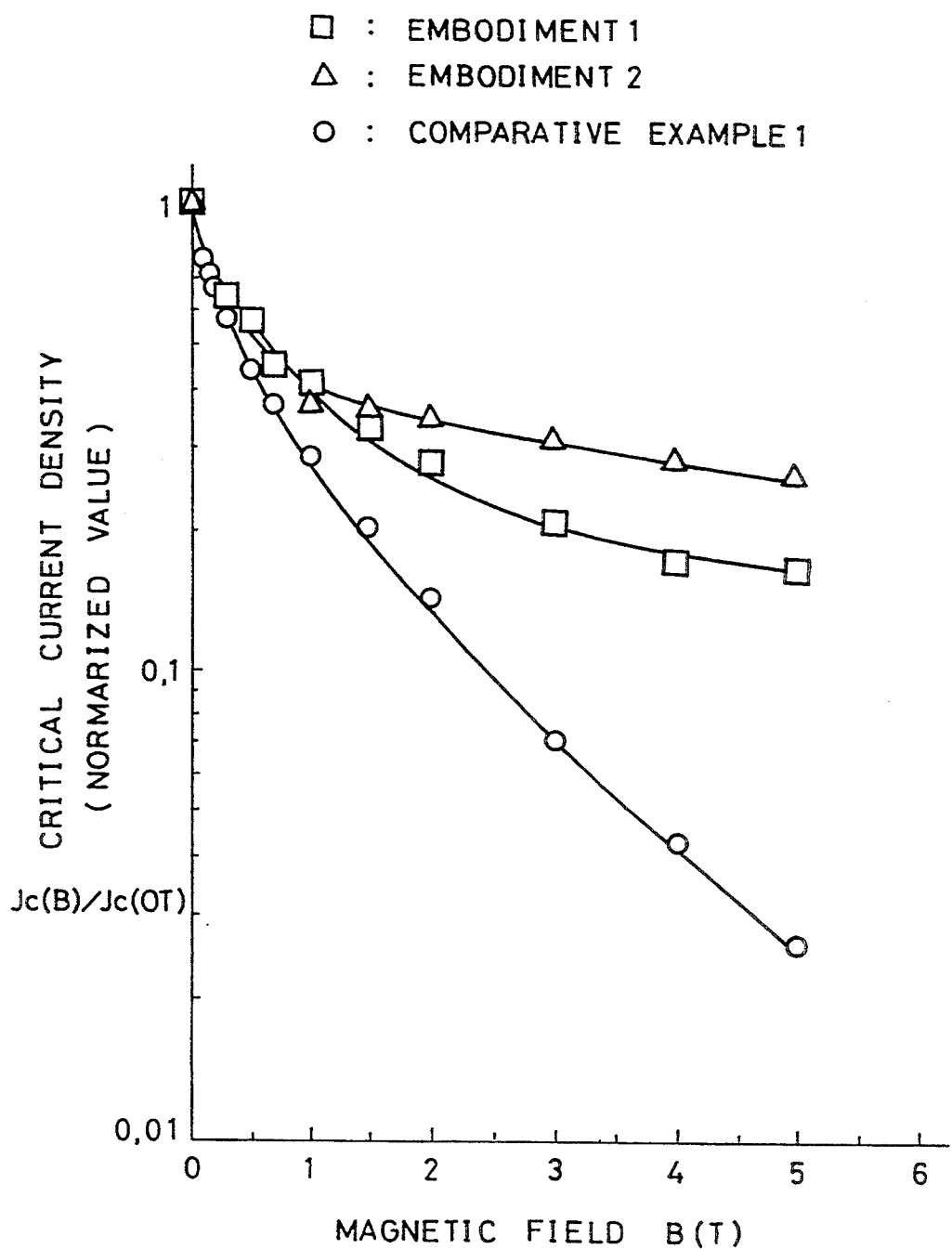
FIG. 1 shows a graph illustrating the results of measuring a magnetic field dependence of the critical current density (normalized values) in Embodiment 1, Embodiment 2 and Comparative Example 1.

A method for manufacturing an oxide superconductor will be described below.

In order to disperse at least one compound selected from the group consisting of SrO, CuO and $(Ca_{1-x}Sr_x)_2CuO_3$ (wherein $0 \leq x < 1$) in superconducting crystal of $Bi_2Sr_2Ca_1Cu_2O_y$ (wherein y is about 8), metal compounds of Bi, Sr, Ca and Cu are mixed in a mole ratio such that Bi: Sr: Ca: Cu=2:2+a:1+b:2+c (wherein $a \geq 0$, $b \geq 0$, $c \geq 0$, and $0 < a+b+c < 3$). $a+b+c$ must satisfy the relation $0 < a+b+c < 3$, but it is preferable that $1 < a+b+c < 2$. If $a+b+c=0$, pinning centers cannot be introduced into the superconducting crystal. While if this sum is greater than 3, segregation tends to occur at grain boundaries. This segregation leads to a decrease of the critical temperature Tc and a decrease of the critical current density Jc and has an adverse effect on superconducting properties.

The metal compounds of Bi, Sr, Ca and Cu are metal oxide powders or carbonate powders, but they may equally well consist of other powders.

To obtain a starting composition, the metal compounds of Bi, Sr, Ca and Cu are calcined in an atmosphere of air at a temperature of 800° C.-900° C. for a period of 30 hours-100 hours, thereby thermally decomposed, made to undergo a solid phase reaction, and then ground.

In order to finely disperse at least one of the compounds SrO and CaO which act as growth nuclei for the precipitate, the starting composition is melted at a temperature of 900° C.-1500° C. (more preferably at a temperature of 1000° C.-1200° C.), and then rapidly quenched.

If a temperature is less than 900° C., the starting composition does not melt completely, the growth nuclei of the precipitate are not dispersed and phases other than the growth nuclei of the precipitate remain in the superconducting crystal. If on the other hand the temperature is higher than 1500° C., the starting composition tends to bump, Bi and other metal compounds are partially vaporized, and the proportion of the metal compounds changes. It is moreover preferable to carry out the melting process for a period of 5 minutes-15 minutes in an atmosphere of air.

The aforesaid rapid quenching is carried out by allowing the molten sample to flow onto a copper plate and then almost simultaneously to trap the sample between the copper plate and another copper plate. The period of rapid quenching should preferably be as short as possible, and it is generally not more than 1 second.

To grow the superconducting crystal, the quenched starting material is then subjected to annealing at a partial molten temperature of 800° C.-1000° C. (more preferably 870° C-930° C.) by a furnace. The annealing period should preferably be about 5 minutes-30 minutes, but is more preferably 10 minutes-20 minutes. This annealing treatment is carried out in an atmosphere of oxygen or the like. It is moreover preferable that the temperature is increased to the annealing temperature at a rate of 100° C.-500° C. per hour. If the annealing temperature is less than 800° C., the sample does not achieve a partial molten state, while if this temperature is higher than 1000° C. the shape of the sample cannot be maintained.

Next, the sample is gradually cooled to 800° C.-900° C. (preferably 830° C.-870° C.), at a rate of $-0.1°$ C.--10° C. per hour (preferably $-0.5°$ C.--2° C. per hour), and the furnace is then allowed to cool to room temperature. If the rate of gradual cooling is greater than $-10°$ C. per hour, the superconducting crystal does not grow well.

In this manner, depending on the starting composition and annealing conditions, an oxide superconductor including a fine dispersion of at least one compound selected from the group consisting of SrO, CuO and $(Ca_{1-x}Sr_x)_2CuO_3$, in the superconducting crystal of $Bi_2Sr_2Ca_1Cu_2O_y$, the size of dispersed particles being of the order of 1.0 μm-0.1 μm, may be obtained.

This invention will now be described in more detail.

Embodiment 1

In order to obtain a starting composition, 1.0 mole of $Bi_2O_3$, 2.0 moles of $SrO_3$, 3.0 moles of $CaCO_3$ and 3.0 moles of CuO were mixed in a motorized mortar, calcined at 840° C. for 50 hours, grinded and then homogenized in a motorized mortar. The powder obtained was melted in a furnace at 1200° C. for 10 minutes. The product was then rapidly quenched by trapping it between copper plates at room temperature to give a precursor of thickness 1 mm and diameter approximately 5 cm. The temperature of this precursor was raised in an atmosphere of oxygen to 900° C. over a period of 2 hours, annealing was carried out at a partial molten temperature of 900° C. for 10 minutes, the temperature gradually cooled to 850° C. over a period of 100 hours, and the furnace then cooled to room temperature. The sample obtained was used for measurement of properties.

Prior to measuring superconducting properties, it was confirmed by means of SEM (Scanning Electron Microscope) and EPMA (Electron Probe Microanalyser) that the sample consisted of a $Bi_2Sr_2Ca_1Cu_2O_y$ superconductor and a fine dispersion of $Ca_2CuO_3$ particles of sizes in the range of 1.0 μm-0.1 μm in crystalline grains of the superconductor, A piece of size 2 mm×2 mm×30 mm was then cut out from the sample, and its superconducting properties were measured. The critical current density Jc and its magnetic field dependence were measured at 20K and at a magnetic field of 0 Tesla.

The results are shown in Table 1 and FIG. 1. For comparison purposes, the critical current density Jc(B) at magnetic field of B Tesla is normalized with reference to the critical current density Jc(0 T) at magnetic field of 0 Tesla.

Embodiment 2

In order to obtain a starting composition, 1.0 mole of $Bi_2O_3$, 3.0 moles of $SrCO_3$, 1.0 mole of $CaCO_3$ and 2.0 moles of CuO were mixed in a motorized mortar, calcined at 840° C. for 50 hours, grinded and then homogenized in a motorized mortar. The product was melted, quenched and annealed under the same conditions as in Embodiment 1 so as to give a sample for measurement of properties.

Prior to measuring superconducting properties, it was confirmed by means of SEM and EPMA that the sample consisted of a $Bi_2Sr_2Ca_1Cu_2O_y$ superconductor and a fine dispersion of SrO particles of sizes in the range 1.0 μm-0.1 μm in crystalline grains of the superconductor. A piece of size 2 mm×2 mm×30 mm was then cut out from the sample, and its superconducting properties were measured in exactly the same way as in Embodiment 1. The results are shown in Table 1 and FIG. 1.

Comparative Example 1

In order to obtain a starting composition, 1.0 mole of $Bi_2O_3$, 2.0 moles of $SrCO_3$, 1.0 mole of $CaCO_3$ and 2.0 moles of CuO were mixed, calcined at 840° C. for 50 hours, grinded and then homogenized in a motorized mortar. The product was melted, quenched and annealed under the same conditions as in Embodiment 1 so as to give a sample for measurement of properties.

Prior to measuring superconducting properties, it was confirmed by means of SEM and EPMA that the sample consisted of only of a $Bi_2Sr_2Ca_1Cu_2O_y$ superconductor. A piece of size 2 mm×2 mm×30 mm was then cut out from the sample, and its superconducting properties were measured in exactly the same way as in Embodiments 1 and 2. The results are shown in Table 1 and FIG. 1.

TABLE 1

| Example | Tc(K.) | Jc at 20 K., OT (A/cm$^2$) |
|---|---|---|
| Embodiment 1 | 80.0 | 3000 |
| Embodiment 2 | 80.0 | 3000 |
| Comparative Example 1 | 80.2 | 500 |

From Table 1, it is seen that the critical temperature Tc in Embodiments 1 and 2 according to the present invention is practically the same as that of Comparative Example 1. It is thus evident that the precipitate does not have any adverse effect on the crystallinity or homogeneity of the superconducting phase. Further, it is seen that the critical current density Jc at 20K for Embodiments 1 and 2 is higher than for Comparative Example 1, and that current flows more easily. Further, from observation of the microstructure of the samples prepared in Embodiments 1 and 2 using SEM and EPMA, it was found that the oxide superconductor manufactured according to the method of this invention consisted of crystalline grains and a fine dispersion of a precipitate of size 1.0 μm–0.1 μm in the crystalline grains, and that this dispersion had no adverse effect on the connectivity of the crystalline grains.

It is also seen from FIG. 1 that the decrease of critical current density Jc(B)/Jc(0T) due to an external magnetic field B Tesla is less in Embodiments 1 and 2 than in Comparative Example 1, and that magnetic field dependence characteristics are improved. This is because the precipitate dispersed in the crystalline grains effectively provides pinning centers.

Embodiment 3

In order to obtain a starting composition rich in Ca and Cu, 1.0 mole of $Bi_2O_3$ powder, 2.0 moles of $SrCO_3$ powder, 3.0 moles of $CaCO_3$ powder and 3.0 moles of CuO powder were mixed and calcined. The calcined powder was then melted in a platinum crucible at 1100° C. for 10 minutes. The product was quenched on copper plates by trapping between the copper plates at room temperature to obtain a precursor of thickness 1 mm and diameter approximately 5 cm. This precursor was subjected to annealing in an atmosphere of oxygen at a partial molten temperature of 900° C. (raising the temperature to 900° C. over a period of 2 hours, and then holding the temperature at 900° C. for 10 minutes), and superconducting crystal was grown at 875° C. (gradually cooling to 875° C. over a period of 50 hours) so as to obtain a sample consisting of a large number of superconducting crystals of $Bi_2Sr_2Ca_1Cu_2O_y$ grown in a plate-like material.

Structural observations were made on the sample obtained by optical microscope, SEM and EPMA. From an optical micrograph of the polished surface of the sample, it was ascertained that the sample contained a large number of crystals of approximately 1 mm size. Further, from EPMA, it was confirmed that needle-like or block-like $Ca_2CuO_3$ was finely dispersed in the superconducting crystal.

Figure 2:
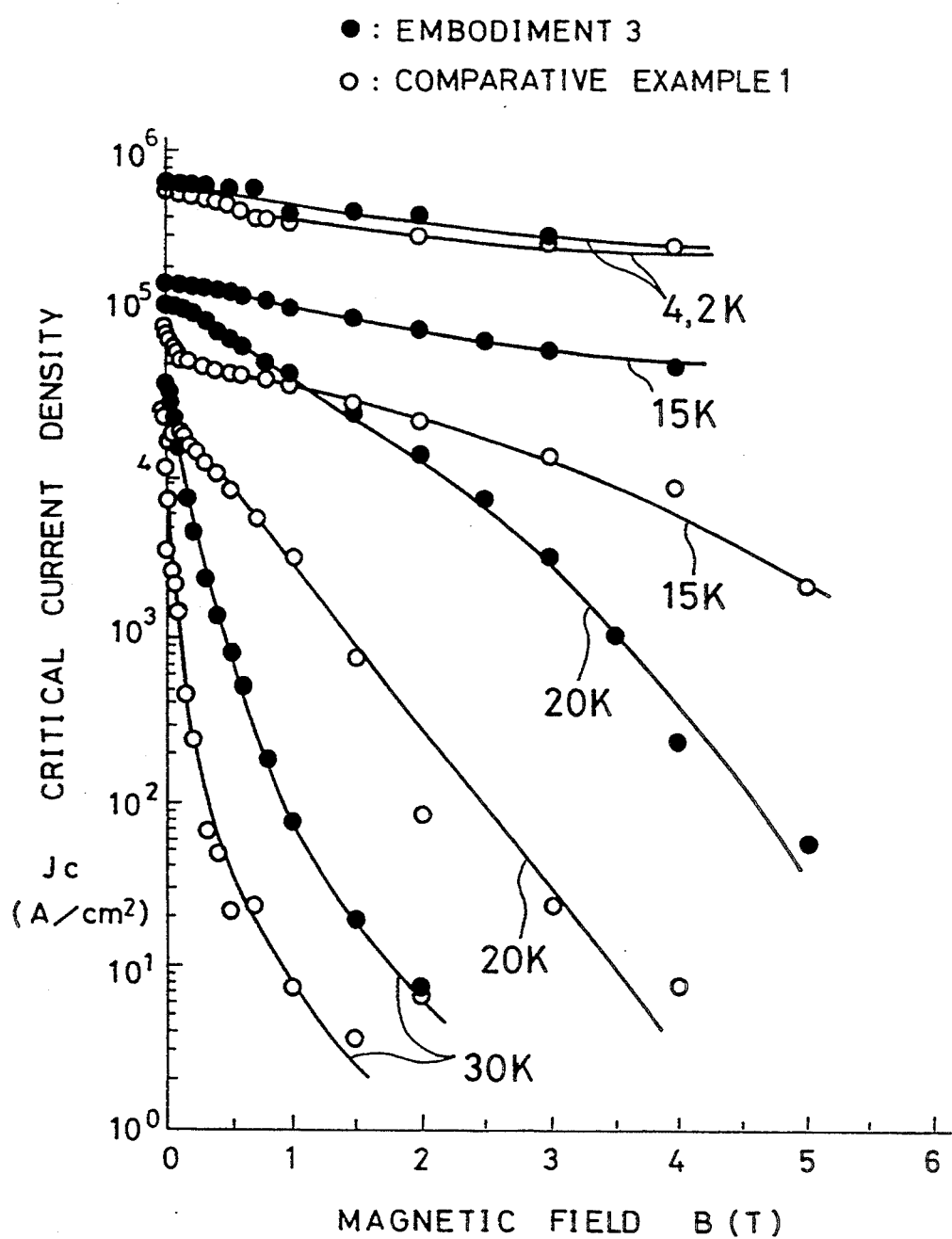
FIG. 2 shows a graph illustrating the results of measuring a magnetic field dependence of the critical current density in Embodiment 3 and Comparative Example 1.

Next, a test piece was cut out from this sample, and the critical current density $J_{cM}$ was evaluated by measuring the magnetization of the sample. In FIG. 2, the field dependency of $J_{cM}$ at 4.2K, 15K, 20K and 30K is shown by the symbol ●. In this measurement, the magnetic field of B Tesla was superimposed parallel to the c axis (crystallographic axis) of the superconducting crystal.

Further, the critical current density $J_{cM}$ of Comparative Example 1 was measured by the same way as in Embodiment 3. The results are shown in FIG. 2 by the symbol ○.

From FIG. 2, it is seen that the sample of Embodiment 3 has a much improved field dependency compared to the sample of Comparative Example 1 and the improved properties is obtained at a temperature of 15K or more. This shows that in the $Bi_2Sr_2Ca_1Cu_2O_y$ superconducting phase, pinning centers consisting of $Ca_2CuO_3$ can be introduced by the manufacturing method of this invention.

In the above embodiments, the critical current density was improved by precipitating $Ca_2CuO_3$ or SrO in the superconducting crystal. It was moreover confirmed that the same effect is obtained by precipitating CuO or $(Ca_{1-x}Sr_x)_2CuO_3$, or by a combination of these precipitates.

As described above, the above-described embodiments provide a method for manufacturing an oxide superconductor consisting of a fine dispersion of at least one of the compounds SrO, CuO and $(Ca_{1-x}Sr_x)_2CuO_3$ in superconducting crystal. According to the above embodiments, therefore, the magnetic field dependence of critical current density of an oxide superconductor can be improved.

Some further embodiments of the present invention will now be described.

Embodiment 4

$Bi_2O_3$, PbO, $SrCO_3$, $CaCO_3$ and CuO powders were mixed such that the mole ratio Bi:Sr:Ca:Cu=2:2:1.4:2.2, and were heated at 845° C. in air for 50 hours. After this heating, particles of platinum strontium oxide (Mole ratio of platinum to platinum strontium oxide is in the range of 0.4–1.0, an average particle diameter of platinum strontium oxide is in the range of 2μm–100 μm, and weight percent of platinum strontium oxide to the product is in the range of 0 wt % –10 wt %.) were mixed with the product. The superconducting properties of the sample can be varied by adjusting the amount of strontium with respect to platinum in the particles which are added to the sample. This is because the hysteresis of magnetization tends to increase even if a small amount of the strontium migrates out of the $Bi_2Sr_2Ca_1Cu_2O_y$ crystal to the platinum strontium oxide.

After mixing, the sample was placed in a platinum crucible, melted by high frequency heating at a temperature of 1300° C.–1600° C. (for example at 1500° C.), and then quenched on metal plates so that the product contains an amorphous component. To confer superconducting properties on the product, it was heated in an oxidizing atmosphere at a temperature of 800° C.–950° C. (a temperature at which the partial molten state of the product is maintained) such as for example 910° C., and gradually cooled at a rate of −1° C. per hour to 865° C. The critical temperature Tc of the sample obtained was 81K. Further, the precipitate including platinum as a principal component did not lower the critical temperature of the sample.

Figure 3:
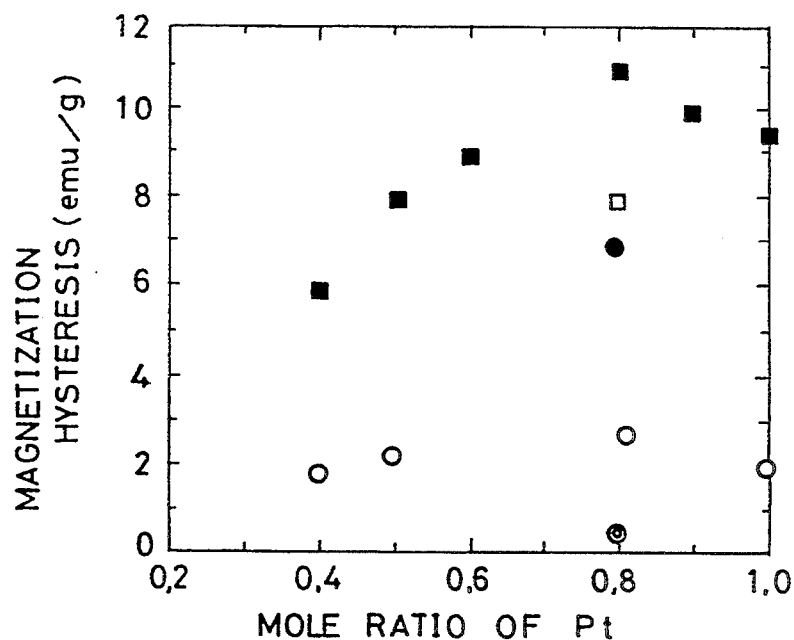
FIG. 3 is a drawing illustrating the results of measuring a relationship between a mole ratio of Pt and hysteresis of magnetization in Embodiment 4.

FIG. 3 shows a characteristic of the oxide superconductor according to this embodiment. This graph illustrates the relationship between hysteresis of magnetization and mole ratio of platinum to platinum strontium oxide. In FIG. 3, the symbol □ corresponds to a particle diameter of 2 μm, ■ to a particle diameter of 5 μm, ● to a particle diameter of 8 μm, ○ to a particle diameter of 10 μm, and ◉ to a particle diameter of 100 μm. In FIG. 3, the sample contains 3 wt % of platinum strontium oxide. Samples were measured at a temperature of 20K and at magnetic field of 3 Tesla. The sample consisted of several crystalline phases with their c axes aligned, and the magnetic field was applied parallel to the c axes.

From FIG. 3, it is seen that a peak is obtained when the platinum content of the platinum strontium oxide is 0.5 or higher, and it is therefore desirable that the mole ratio of platinum should be no less than 0.5. It is also seen that when the particle diameter is 100 μm or more, there is not much difference from the case when no particles are added. On the other hand, the effect obtained is very marked when the particle diameter is 10 μm or less.

Further, from EPMA, it is seen that whereas some metal remains even after annealing when the particles added have a size of 10 μm or more, it is dispersed in the form of oxide particles of size 1 μm or less when the particles added have a size of 5 μm or less. It is therefore desirable that the particles added have a diameter not exceeding 5 μm. In other words, by limiting the diameter of the added particle, it is possible to obtain a dispersion of particles of 1 μm or less in the superconductor, and to increase hysteresis of magnetization.

Figure 4:
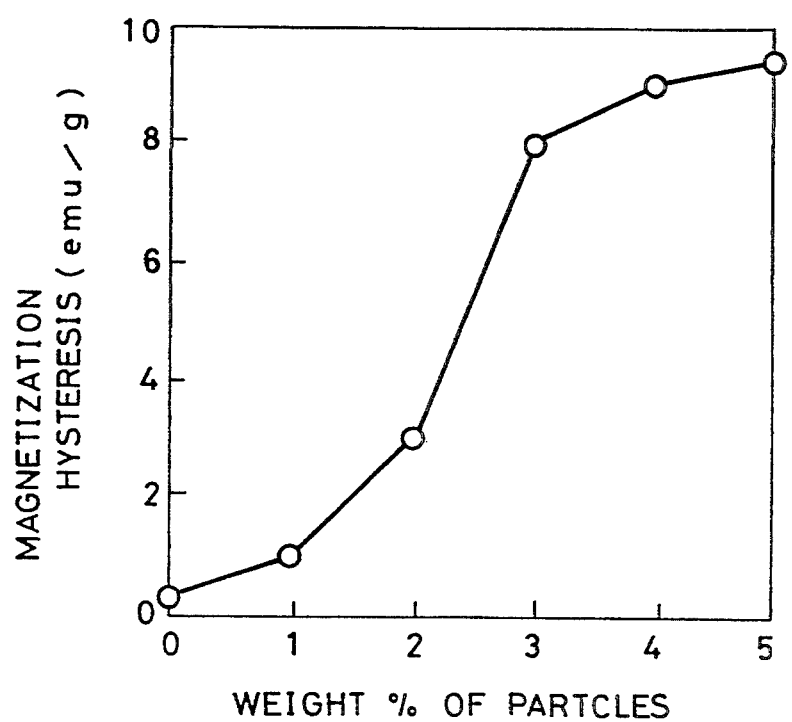
FIG. 4 is a drawing illustrating the variation of hysteresis of magnetization according to the amount of added particles including Pt in Embodiment 4.

FIG. 4 is a drawing illustrating the variation of hysteresis of magnetization (emu/g) according to the amount of added particles (wt %) including Pt in Embodiment 4. The mole ratio of platinum to strontium in the added particles was 1:1, and their diameter is 5 μm. Samples were measured at 20K and at the magnetic field of 3 Tesla applied parallel to the c axis.

As can be seen from FIG. 4, the hysteresis of magnetization was almost constant for 3 wt % or more of added particles. When the amount of particles reaches 10 wt %, a residue consisting of platinum and strontium is left in the crucible. Therefore, an addition of 5 wt % or less is to be preferred from the viewpoint of effective use of the platinum. In the case of 0 wt % in FIG. 4, no particles were added and the superconductor was melted in a palladium crucible.

Further, if 2 wt % or more of platinum is added before the composition is melted, dissolution of the platinum of the crucible can be inhibited and deterioration of the crucible lessened. To avoid wastage of platinum, it is therefore desirable to maintain the initial platinum content below 10 wt %. When the starting material is melted in a platinum crucible without any addition of platinum, the amount of platinum dissolved from the crucible is up to 1 wt %.

Embodiment 5

Figure 5:
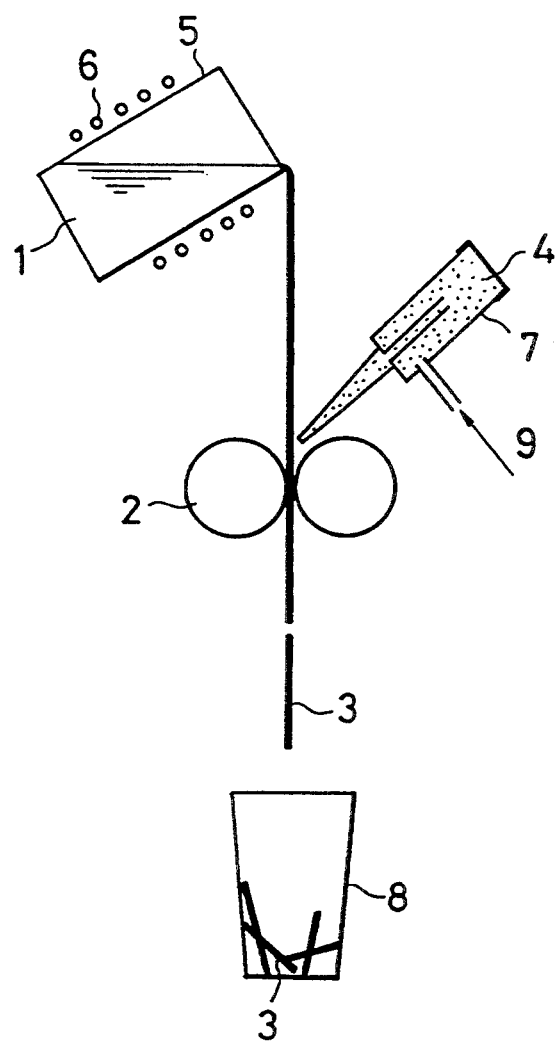
FIG. 5 is a descriptive drawing showing the mixing process of the particles by a nozzle and the quenching process by twin rollers in Embodiment 5.

FIG. 5 is a descriptive drawing showing the mixing process of particles including Pt by a nozzle and the quenching process by twin rollers.

In FIG. 5, numeral 1 is a molten starting material consisting of oxide which becomes superconducting crystal through annealing, 2 are twin metal rollers, 3 is a quenched and solidified oxide. Furthermore, numeral 4 is a mixture of platinum powder and platinum strontium oxide powder, 5 is a platinum crucible 6 is a heater, 7 is a particle sprayer, 8 is a bucket, and 9 is Ar or N₂ gas for spraying. In FIG. 5, the nozzle for spraying particles is disposed close to the gap between the twin metal rollers 2 which are used for quenching the molten starting composition. After spraying particles into the molten starting material 1, the latter is rapidly solidified. Aggregation of the spraying particles is thereby avoided.

To obtain the starting composition consisting of oxide powder, $Bi_2O_3$, PbO, $SrCO_3$, $CaCO_3$ and CuO were mixed in such a proportion that the mole ratio Bi:Sr:Ca:Cu=2:2:1.4:2.2, and the composition was heated in air at 845° C. for 50 hours. As shown in FIG. 5, the product was then introduced into a platinum crucible 5, and melted at 1500° C. by high frequency heating. At the same time, the particles were sprayed onto the falling molten material by means of argon or nitrogen gas 9 as carrier using a sprayer 7. Further, the twin metal rollers 2 for quenching the molten material was rotated at a peripheral speed of at least 20 m/sec. In particular, the gap of twin rollers 2 was set to be 1 mm or less. After quenching the molten material, the quenched oxide was grinded and compression-molded to form a sample of diameter 20 mm and thickness 5 mm. The product was then annealed in air at 905° C. for a period of 24 hours to give a superconductor having a critical temperature of 80K. Further, there was no decrease of the critical temperature when the quenched oxide was annealed to give it superconducting properties.

Figure 6:
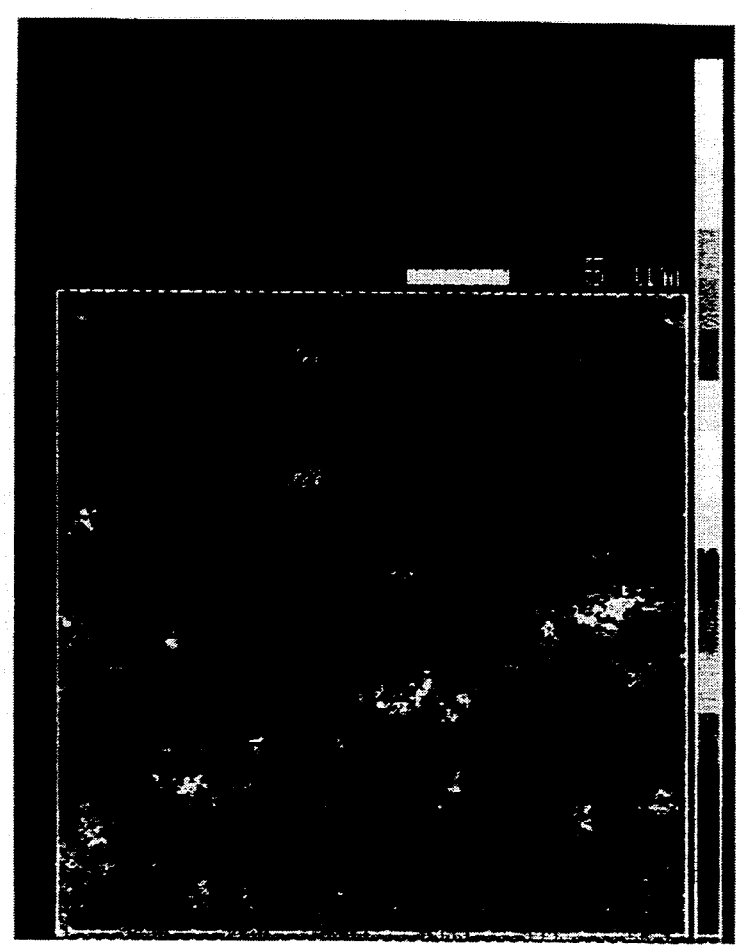
FIG. 6 is a X-ray image of platinum element obtained by EPMA for Embodiment 5.

The photograph of FIG. 6 is a X-ray image of platinum element obtained by EPMA observing the polished surface of the sample of Embodiment 5. The photograph shows that the particles are dispersed in the quenched oxide at high density.

Further, the detected X-ray intensity is stronger in the precipitate of platinum than in the superconducting crystal. The platinum and strontium oxide content was moreover quantitatively evaluated on the basis of specific area (ratio of the surface area of precipitate to the entire surface area) by optical microphotograph.

Table 2 shows values of hysteresis of magnetization at a temperature of 10K and an applied field of 3 Tesla. The samples used for measurements were approximately 1 mm square×0.1 mm thick, that the c axes of the sample were aligned, and that the sample was arranged such that the c axis and the applied field were parallel. From Table 2, it was found that the hysteresis of magnetization was greater for larger amount of precipitates (i.e. larger specific area).

TABLE 2

| Specific area | 0 | 0.60 | 2.50 | 7.0 |
|---|---|---|---|---|
| Hysteresis of magnetization | 0.31 | 1.40 | 3.16 | 14.0 |

TABLE 2-continued (emu/g)

Embodiment 6

Figure 7:
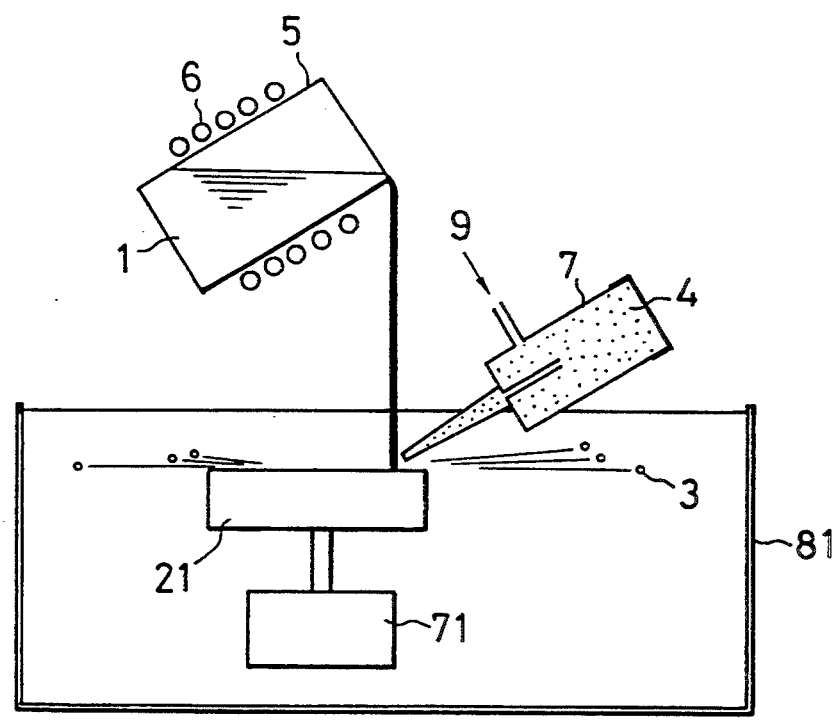
FIG. 7 is a descriptive drawing showing the mixing process of the particles by a nozzle and the quenching process by rotating disc in Embodiment 6.

FIG. 7 is a descriptive drawing showing the mixing process of particles including Pt by a nozzle and the quenching process by rotation disc.

In FIG. 7, numeral 1 is a molten starting material, 21 is a rotating metal disc, 3 is a solidified oxide, 4 is a mixture of platinum and platinum strontium oxide powder, 5 is a platinum crucible, 6 is a heater, 71 is a motor, 81 is a sample receptacle, 7 is a particle sprayer, and 9 is Ar or $N_2$ gas for spraying. In FIG. 7, the nozzle for spraying particles into the molten starting material is disposed close to the surface of the rotating metal disc 21. After spraying particles into the molten starting material 1, the latter is rapidly solidified. Aggregation of the spraying particles is thereby avoided.

To obtain the starting composition consisting of oxide powder, $Bi_2O_3$, PbO, $SrCO_3$, $CaCO_3$ and CuO were mixed in such a proportion that the mole ratio Bi: Sr: Ca: Cu=2:2:1.4:2.2, and the composition was heated in air at 845° C. for 50 hours. As shown in FIG. 7, the product was then introduced into a platinum crucible 5, and melted at 1500° C. by high frequency heating. At the same time, the particles 4 were sprayed onto the falling molten material by means of Ar or $N_2$ gas 9 as carrier using a sprayer 7 as shown in FIG. 7. Further, the peripheral speed of the disc 21 which the molten oxide was made to strike was at least 20 m/sec in order that the molten material easily formed an amorphous product during the quenching process. The solidified oxide 3 obtained (average particle diameter 20 $\mu$) was compression-molded (diameter 20 mm×thickness 5 mm). The product was then annealed in air at 905° C. for a period of 24 hours to give a sample having a critical temperature of 80K.

The X-ray image of platinum element obtained by EPMA observing the polished surface of the aforesaid sample, was identical to the aforesaid photograph. As the molten material is quenched on the rotating metal disc immediately after spraying fine particles into it at high speed, a fine powder of quenched oxide is obtained wherein the particles are dispersed at high density.

Further, the detected X-ray intensity is stronger in the precipitate of platinum than in the superconducting crystal. The platinum and strontium oxide content was moreover quantitatively evaluated as a specific surface by optical microphotograph.

Table 3 shows values of hysteresis of magnetization at a temperature of 20K and an applied field of 3 Tesla. The samples used for measurements were approximately 1 mm square×0.1 mm thick, that the c axes of the sample were aligned, and that the sample was arranged such that the c axis and the applied field were parallel. From Table 3, it was found that the hysteresis of magnetization was greater for larger amount of precipitates (i.e. larger specific area).

TABLE 3

| Specific area | 0 | 1.70 | 2.40 | 5.0 |
|---|---|---|---|---|
| Hysteresis of Magnetization (emu/g) | 0.31 | 2.5 | 3.0 | 12.0 |

According to the above embodiment, therefore, the critical current density, which can be estimated from the hysteresis of magnetization by using the Bean model of an oxide superconductor having a high critical temperature can be improved.

What is claimed is:

1. An oxide superconductor comprising:
   a superconducting crystal including Bi, Sr, Ca and Cu oxides, and
   separate oxide phases, each including Pt as a principal component,
   wherein said separate oxide phases are finely dispersed in said superconducting crystal; and
   wherein each of said separate oxide phases further includes oxides of Cu and Sr.

2. The oxide superconductor of claim 1, wherein said superconducting crystal is $Bi_2Sr_2Ca_1Cu_2O_y$ (y is approximately 8).

3. The oxide superconductor of claim 1, wherein a particle diameter of said oxides of Pt, Cu and Sr is in the range of 2 $\mu m$–10 $\mu m$.

* * * * *